United States Patent
Somayajula

(10) Patent No.: US 6,560,451 B1
(45) Date of Patent: May 6, 2003

(54) SQUARE WAVE ANALOG MULTIPLIER

(75) Inventor: Shyam S. Somayajula, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/419,311

(22) Filed: Oct. 15, 1999

(51) Int. Cl.$^7$ .................. H04B 1/26; H03B 19/00
(52) U.S. Cl. ............... 455/318; 455/323; 455/333; 327/113
(58) Field of Search ................. 455/323, 318, 455/319, 330, 333, 326, 325, 313, 315; 327/113, 355, 356, 357, 358, 359, 360, 361

(56) References Cited

U.S. PATENT DOCUMENTS

| | | | |
|---|---|---|---|
| 5,438,693 A | 8/1995 | Cox | 455/333 |
| 5,493,720 A | 2/1996 | Peterson | 455/326 |
| 5,548,219 A | 8/1996 | Sinclair | 324/338 |
| 5,697,091 A | 12/1997 | Hirschenberger et al. | 455/318 |
| 5,734,683 A | 3/1998 | Hulkko et al. | 375/316 |
| 5,884,154 A | * 3/1999 | Sano et al. | 455/333 |
| 5,933,771 A | * 8/1999 | Tiller et al. | 455/333 |
| 6,040,731 A | * 3/2000 | Chen et al. | 327/359 |
| 6,144,236 A | * 11/2000 | Vice et al. | 327/113 |

* cited by examiner

Primary Examiner—Vivian Chin
Assistant Examiner—John J Lee
(74) Attorney, Agent, or Firm—Steven Lin, Esq.

(57) ABSTRACT

An analog multiplier or mixer that mixes a signal $f_c$ with a square wave local oscillator improves heterodyning operation of a circuit. In various square wave analog multiplier or mixer embodiments, heterodyning performance is improved in noise reduction, saturation performance, linearity, and other measures by adding a DC current path in parallel to a signal current path of the multiplier or mixer. The parasitic capacitances, noise, and nonlinearity problems in a heterodyning circuit are solved by adding a path to a square wave mixer for carrying the signal current and the DC current on different paths. An apparatus includes a circuit coupled between a first voltage reference and a second voltage reference. The circuit includes a first square wave oscillator branch and a second square wave oscillator branch. The first square wave oscillator branch is driven by a square wave oscillator signal and the second square wave oscillator branch is driven by an inverse of the square wave oscillator signal. The first and second square wave oscillator branches each include a DC current path and a signal current path. The signal current path is driven by the square wave oscillator signal and the inverse of the square wave oscillator signal, respectively.

37 Claims, 12 Drawing Sheets

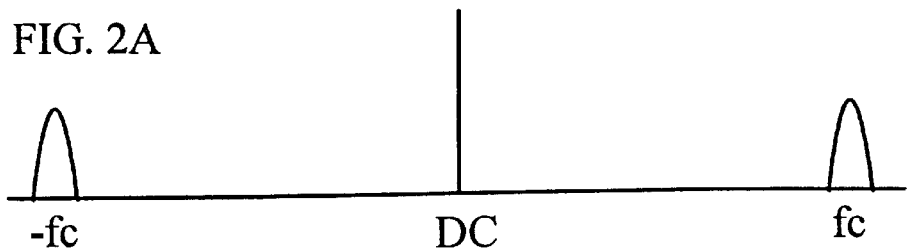
FIG. 2A
-fc   DC   fc
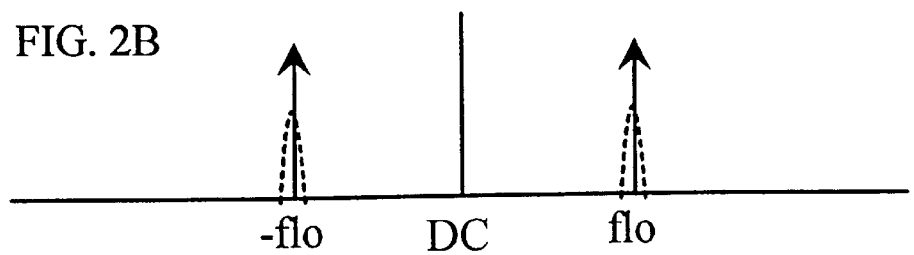
FIG. 2B
-flo   DC   flo
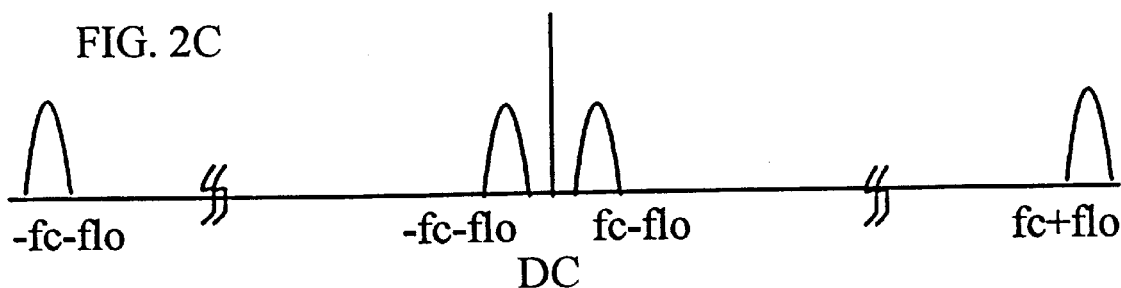
FIG. 2C
-fc-flo   -fc-flo   fc-flo   fc+flo
          DC
FIG. 2D
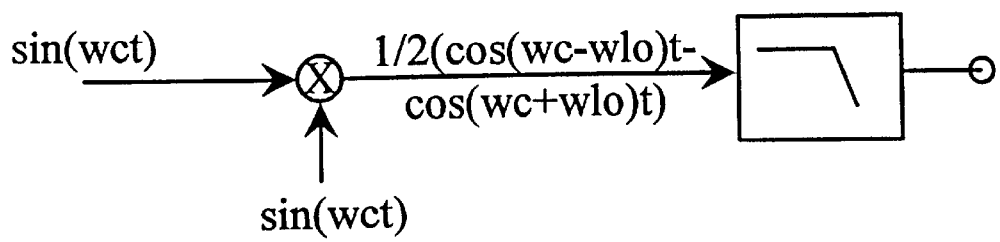
sin(wct) → ⊗ → 1/2(cos(wc-wlo)t - cos(wc+wlo)t) → [filter]
          ↑
      sin(wct)

SQUARE WAVE ANALOG MULTIPLIER

BACKGROUND OF THE INVENTION

1. Field of the Invention

The present invention relates to electronic circuits of various functionality including communication and signal processing circuits. More specifically, the invention relates to heterodyning transceivers that use a square wave local oscillator to mix a radio frequency signal down to a frequency band near DC.

2. Description of the Related Art

Electronic circuits having various functionalities, such as communication functionality, signal processing functionality, and others, employ the principal of heterodyning to translate the frequency content of a signal from a frequency band for which signal processing is difficult to a frequency band for which signal processing is simple. For example, the evolution of portable communication devices to miniscule sizes imposes a market requirement of tiny antennas which in turn requires higher frequencies for transmission and reception in a transceiver circuit. FIG. 1 is a frequency domain graph showing a typical signal frequency characteristic for a signal such as a high frequency communication signal. The communication signal has a relatively narrow bandwidth superimposed upon a high frequency carrier. In an illustrative example, a communication signal may have a bandwidth $f_2-f_1$ of merely 5 MHz centered at a 900 MHz signal. Heterodyne processing is used to shift a narrow band signal centered at a high frequency to a low frequency or vice versa for transmission.

Typical heterodyning circuits in transceiver front ends include analog mixers and multipliers that shift as shown by the frequency domain graphs in FIGS. 2A, 2B, and 2C, and a circuit diagram of an analog multiplier in FIG. 2D. The analog mixer or multiplier translates the frequency spectrum of a communication signal $f_c$ shown in FIG. 2A through the application of a local oscillator which oscillates at a frequency $f_{LO}$. An analog multiplier 200 shown in FIG. 2D shifts the frequency domain content of the communication signal $f_c$ down to near DC, specifically to $f_c-f_{LO}$, as is shown in FIG. 2D. The mixing operation generates harmonics at frequencies $f_c \pm nf_{LO}$. The frequency region of interest is the component $\cos(\omega_c-\omega_{LO})t$, which is typically isolated using a filtering operation or circuit. A local oscillator in the form of a sine wave has a frequency domain characteristic of an impulse as shown in FIG. 2B for a sine wave local oscillator with harmonic indicator n equal to 1.

The multiplication process requires the amplitude of the local oscillator signal to be as large as possible, ideally to be as large as the signal, to avoid signal attenuation at the output. However, the circuits often saturate at signal levels below the ideal value and become non-linear, implying that the local oscillator signal amplitude needs to be precisely controlled and also that local oscillator linearity is important to the extent that harmonics of local oscillator do not mix down additional noise of the mixing devices. Another problem with sinewave oscillators is that the Lo signal is typically connected to a differential pair that operates in the saturation region and therefore produces a significant amount of noise.

One way to avoid noise problems and linearity problems in particular systems is to use a square wave local oscillator signal instead of a sine wave.

SUMMARY OF THE INVENTION

An analog multiplier or mixer that mixes a signal $f_c$ with a square wave local oscillator improves heterodyning operation of a circuit. In various square wave analog multiplier or mixer embodiments, heterodyning performance is improved in noise reduction, saturation performance, linearity, and other measures by adding a DC current path in parallel to a signal current path of the multiplier or mixer.

Practical conventional implementations of a square wave mixer suffer from one or more of the noise, saturation, and linearity problems. In addition to mixing of the signal of interest, a DC bias current is also mixed resulting in large transient signals, and complex mixer behavior. Mixer designs typically attempt to avoid transient signal generation by current steering, thereby dissipating excess signal power and attenuating the signal of interest, disadvantageously increasing noise.

In accordance with one aspect of the present invention, the source of the attenuation is identified and eliminated, overcoming the attenuation and reducing or eliminating noise.

In accordance with one embodiment of the present invention, an apparatus includes a circuit with a first square wave oscillator branch and a second square wave oscillator branch. Both square wave oscillator branches including a DC current path and a signal current path. The signal current path is driven by the square wave oscillator signal and the inverse of the square wave oscillator signal, respectively. The DC current paths in both the branches are biased such that at DC current, the current in the first square wave oscillator branch is equal to the current in the second square wave oscillator branch.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

FIGS. 2A, 2B, and 2C, labeled PRIOR ART, are frequency domain graphs illustrating the general conventional operation of typical heterodyning circuits in transceiver front ends such as analog mixers and multipliers. FIG. 2D, also labeled PRIOR ART, is a highly schematic block diagram showing an analog multiplier.

DESCRIPTION OF THE PREFERRED EMBODIMENT(S)

Figure 1:
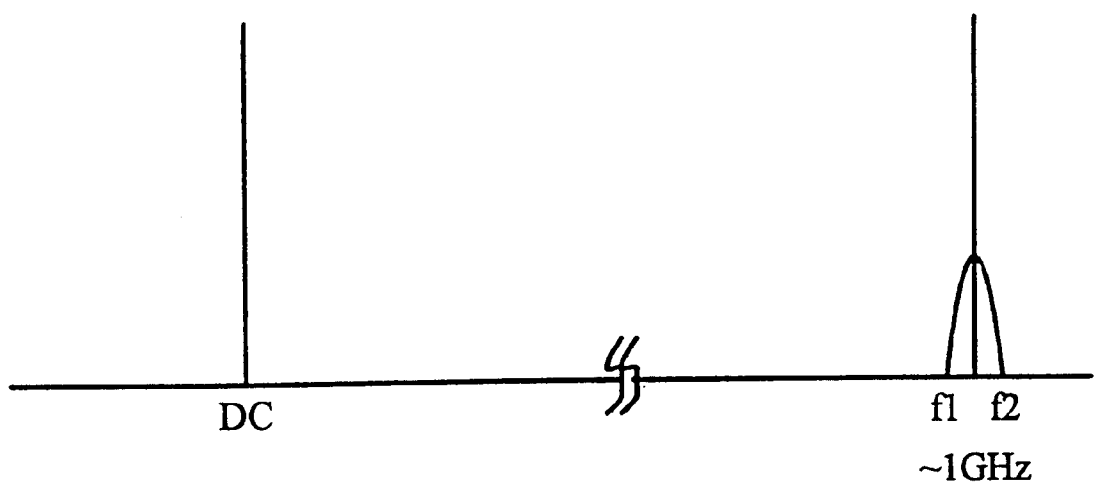
FIG. 1, labeled PRIOR ART, is a frequency domain graph showing a typical signal frequency characteristic for a signal such as a high frequency communication signal.
Figure 3:
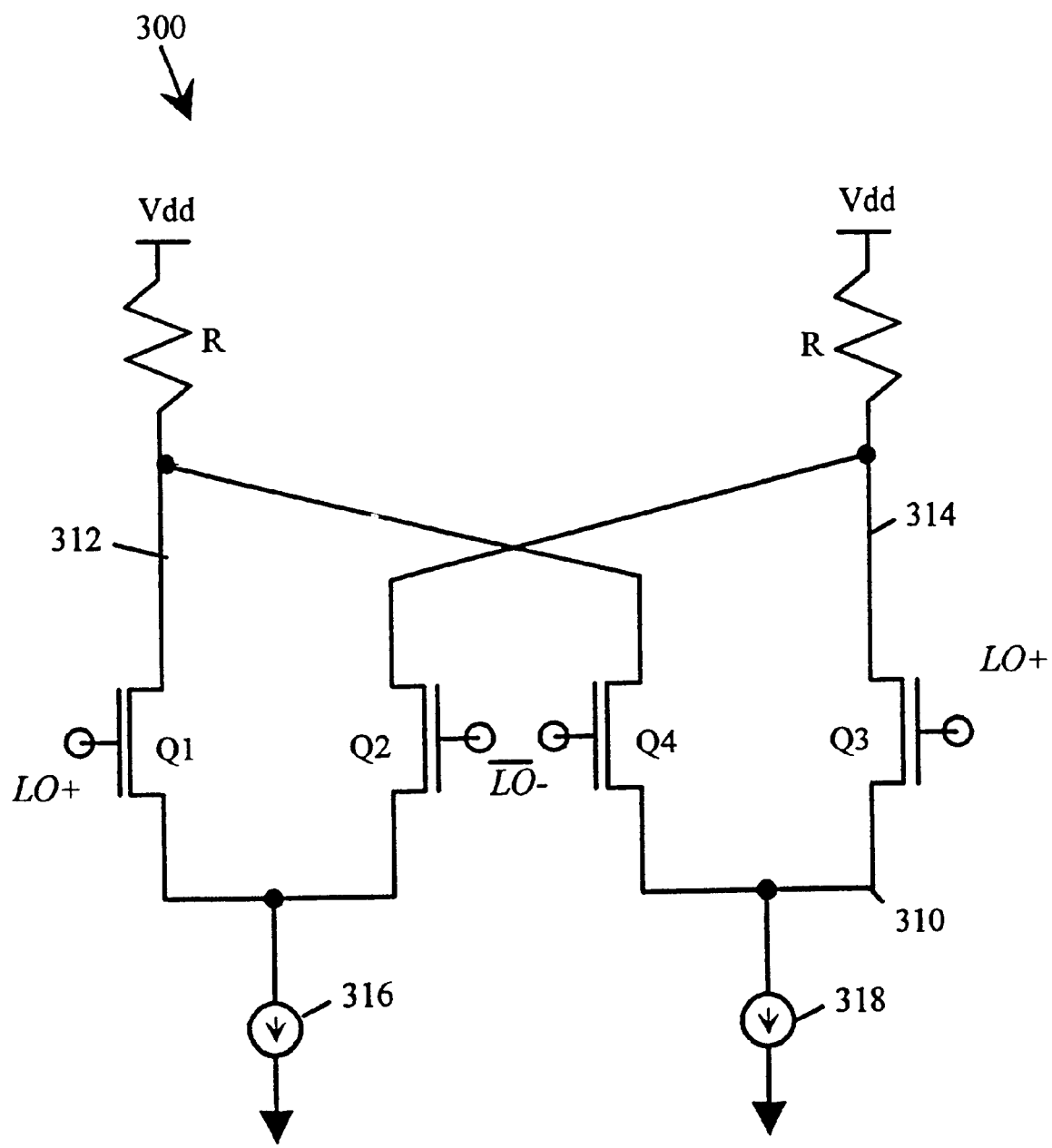
FIG. 3 is a schematic circuit diagram depicting a sine wave analog mixer that translates a high frequency, relatively narrow bandwidth signal down to a frequency region near DC using a mixing operation.

Referring to FIG. 3, a schematic circuit diagram depicts a sine wave analog mixer 300 that translates a high frequency, relatively narrow bandwidth signal down to a frequency region near DC using a mixing operation. The sine wave analog mixer 300 performs analog mixing using a Gilbert cell 310 and a sinusoidal local oscillator signal LO+ and $\overline{LO}$—to translate a radio frequency (RF) signal down to a signal near DC, for example in a communications receiver. A corresponding circuit may be employed in a transmitter to translate a signal near DC to radio frequency operation. The sine wave analog mixer 300 includes two branches 312 and 314, each including a current source 316 and 318, respectively, corresponding to a system input signal. The current source 316 has a current of $g_m V_{rf+}$ and the current source 318 has a current of $g_m V_{rf-}$ where $g_m$ is the transconductance and $V_{rf\pm}$ is the input voltage signal. The branch 312 has a pathway from a voltage supply Vdd to ground through a resistor R, a transistor Q1 controlled by the sinusoidal local oscillator signal LO+, and through the current source 316. A transistor Q2 controlled by the inverse sinusoidal local oscillator signal $\overline{LO}$—is cross-connected from the voltage supply Vdd through a resistor R in the branch 314, and through the current source 316 in the branch 312.

The branch 314 has a pathway from a voltage supply Vdd to ground through a resistor R, a transistor Q3 controlled by the sinusoidal local oscillator signal LO+, and through the current source 318. A transistor Q4 controlled by the inverse sinusoidal local oscillator signal $\overline{LO}$—is cross-connected from the voltage supply Vdd through a resistor R in the branch 312, and through the current source 318 in the branch 314.

The sine wave analog mixer 300 has several disadvantages. The input devices, current sources 316 and 318, operate in saturation, thereby contributing to the noise level of the circuit. In addition, the input devices are forced to have a limited amplitude to maintain operation in the saturation region, implying that the sine wave generator is restricted in amplitude. The smaller the amplitude of the sine wave, the greater the signal attenuation of the translated signal.

Figure 4:
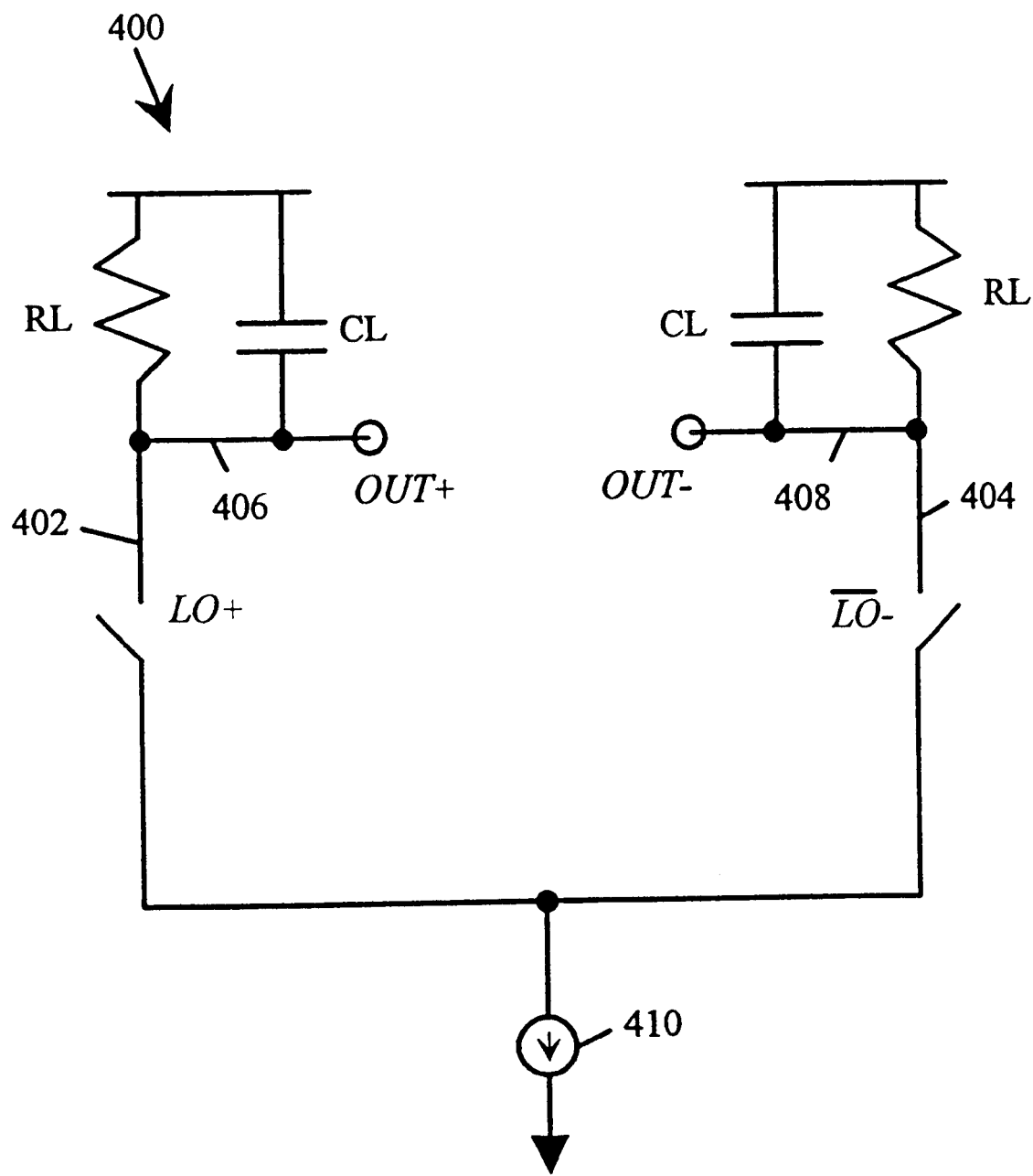
FIG. 4 is a schematic circuit diagram illustrating a square wave mixer that improves heterodyning performance by reducing noise and saturation difficulties.

Referring to FIG. 4, a schematic circuit diagram illustrates a square wave mixer 400 that improves heterodyning performance by reducing noise and saturation difficulties. To facilitate understanding, the described square wave mixer 400 is a single-ended input system, the description being easily extended to fully differential input system by one of average skill in the art. The square wave mixer 400 includes a first branch 402 and a second branch 404. Both the first and second branches 402 and 404 have an RC filter 406 and 408, respectively, connected between a reference voltage supply and an output terminal, $V_{OUT+}$ and $V_{OUT-}$ in the respective branches 402 and 404. The RC filters 406 and 408 in the first and second branches 402 and 404 have equal load resistance values $R_L$ and load capacitance values $C_L$ and filter high frequency components of the mixed signal $f_c \pm n f_{LO}$, leaving the low frequency down-converted signal near DC. The transistors in branches 402 and 404 are not in saturation region and therefore do not contribute any noise.

A square wave oscillator switch LO is connected through the RC filter 406 to the voltage reference source $V_{REF}$ in the first branch 402. In inverted square oscillator switch $\overline{LO}$ is connected through the RC filter 408 in the second branch 404. The two branches 402 and 404 are interconnected at a current source 410 which is connected to a ground reference. The current source 410 has a current of $g_m V_{rf}$ where $g_m$ is the transconductance and $V_{rf}$ is the input voltage signal.

The square wave mixer 400 generates an output voltage according to equations (1) and (2), as follows:

The square wave local oscillator with ±1 $V_{p-p}$ amplitude can be written as:

$$V_{LO} = \tfrac{2}{\pi}\cos \omega_{LO} t - \tfrac{2}{\pi}(\tfrac{1}{3})\cos 3\omega_{LO} t + \tfrac{2}{\pi}(\tfrac{1}{5})\cos 5\omega_{LO} t - \quad (1)$$

hence $$V_{OUT} = V_{OUT+} - V_{OUT-} \quad (2)$$

$$= \tfrac{1}{\pi} g_m R_L [\cos(\omega_{rf} - \omega_{LO})t + \cos(\omega_{rf} + \omega_{LO})t -$$
$$\cos(\omega_{rf} - 3\omega_{LO})t - \cos(\omega_{rf} + 3\omega_{LO})t +$$
$$\cos(\omega_{rf} - 5\omega_{LO})t + \cos(\omega_{rf} + 5\omega_{LO})t + \ldots$$

The bandwidth of $R_L C_L$ is set with the components $(\omega_{rf} \pm n\omega_{LO})$ filtered significantly so that:

$$V_{OUT} = \tfrac{1}{\pi} g_m R_L [\cos(\omega_{rf} - \omega_{LO})t]$$

Figure 5:
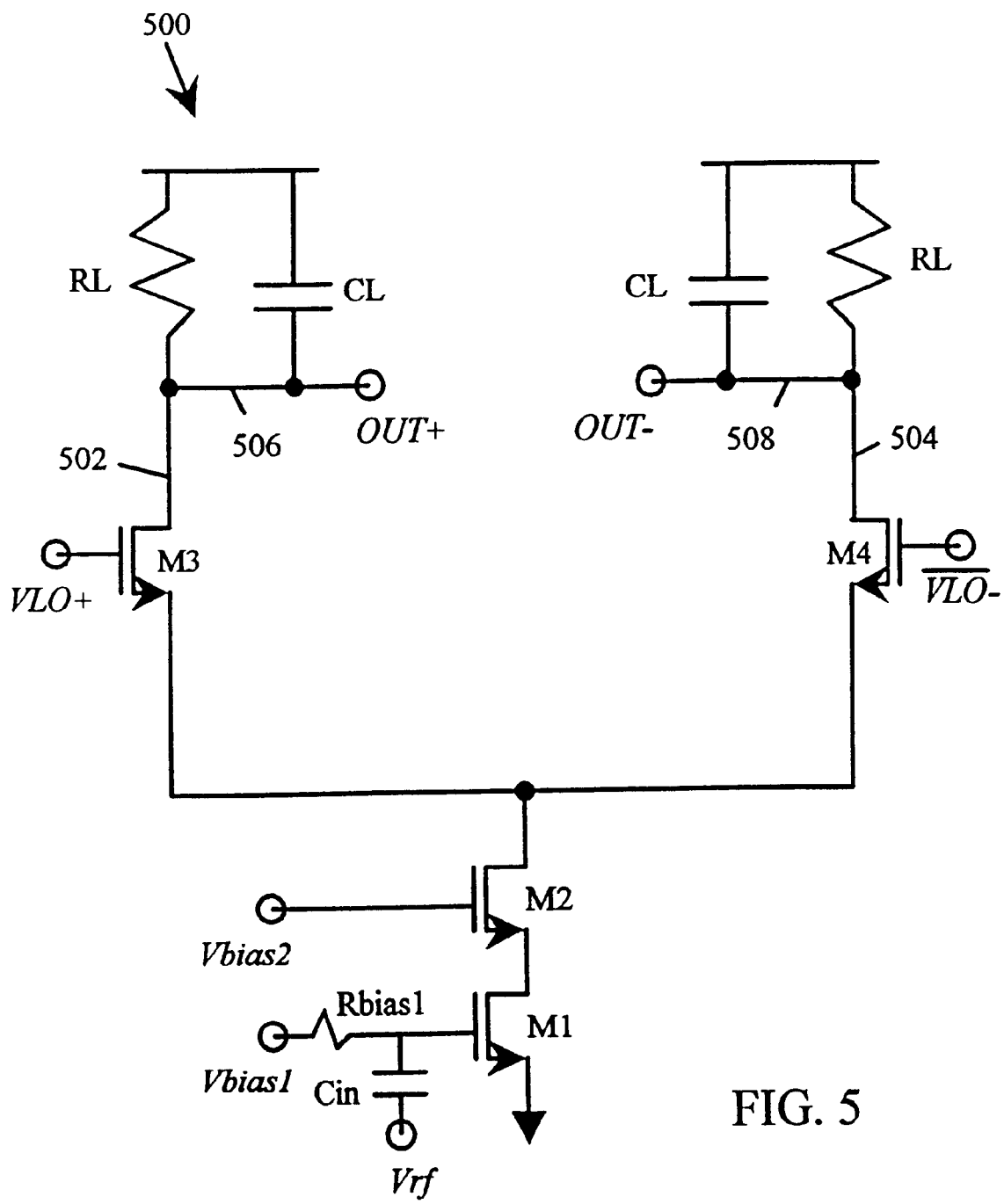
FIG. 5 is a schematic circuit diagram shows an alternative example of a square wave mixer.

Referring to FIG. 5, a schematic circuit diagram shows an alternative example of a square wave mixer 500 that is a more detailed and more practical implementation of a heterodyne mixer. The square wave mixer 500 is similar to the square wave mixer 400 shown in FIG. 4 except that a MOSFET M3 is used in place of the square wave oscillator switch LO in a first branch 502 and a MOSFET M4 is used in place of the inverted square oscillator switch $\overline{LO}$ in a second branch 504. The gate electrode of the MOSFET M3 is driven by a square wave local oscillator signal VLO. The gate electrode of the MOSFET M4 is controlled by a square wave local oscillator signal $\overline{VLO}$. The square wave mixer 500 also includes an input signal MOSFET M1 that replaces the current source 410 of the square wave mixer 400. The gate terminal of the MOSFET M1 is connected to a first biasing voltage source $V_{bias1}$ through a biasing resistor $R_{bias1}$ and also connected to an input voltage source $V_{rf}$ through an input capacitor $C_{IN}$. A biasing MOSFET M2 has a source-drain pathway connected between the interconnected MOSFETs M3 and M4, through to the input signal MOSFET M1. The gate terminal of the biasing MOSFET M2 is connected to a second biasing voltage source $V_{bias2}$.

The square wave mixer 500 has suitable noise characteristics when the transconductance ($g_m$) of the input signal MOSFET M1 is large. Since the size of MOSFET M1 is kept small at the high operating frequencies to limit parasitics, a large transconductance $g_m$ is achieved by increasing the current through the MOSFET M1, for example to a level of approximately 10 mA or higher. The circuit topology of the square wave mixer 500 shown in FIG. 5 does not support the drawing of large DC currents through the load resistors $R_L$ in the first and second branches 502 and 504. For example, typical supply voltage levels of approximately 3 volts are insufficient, and thus impractical, to drive such large DC currents. Otherwise stated, the supply voltages fail to support suitable head room for load resistance values of up to 1KΩ.

Figure 6:
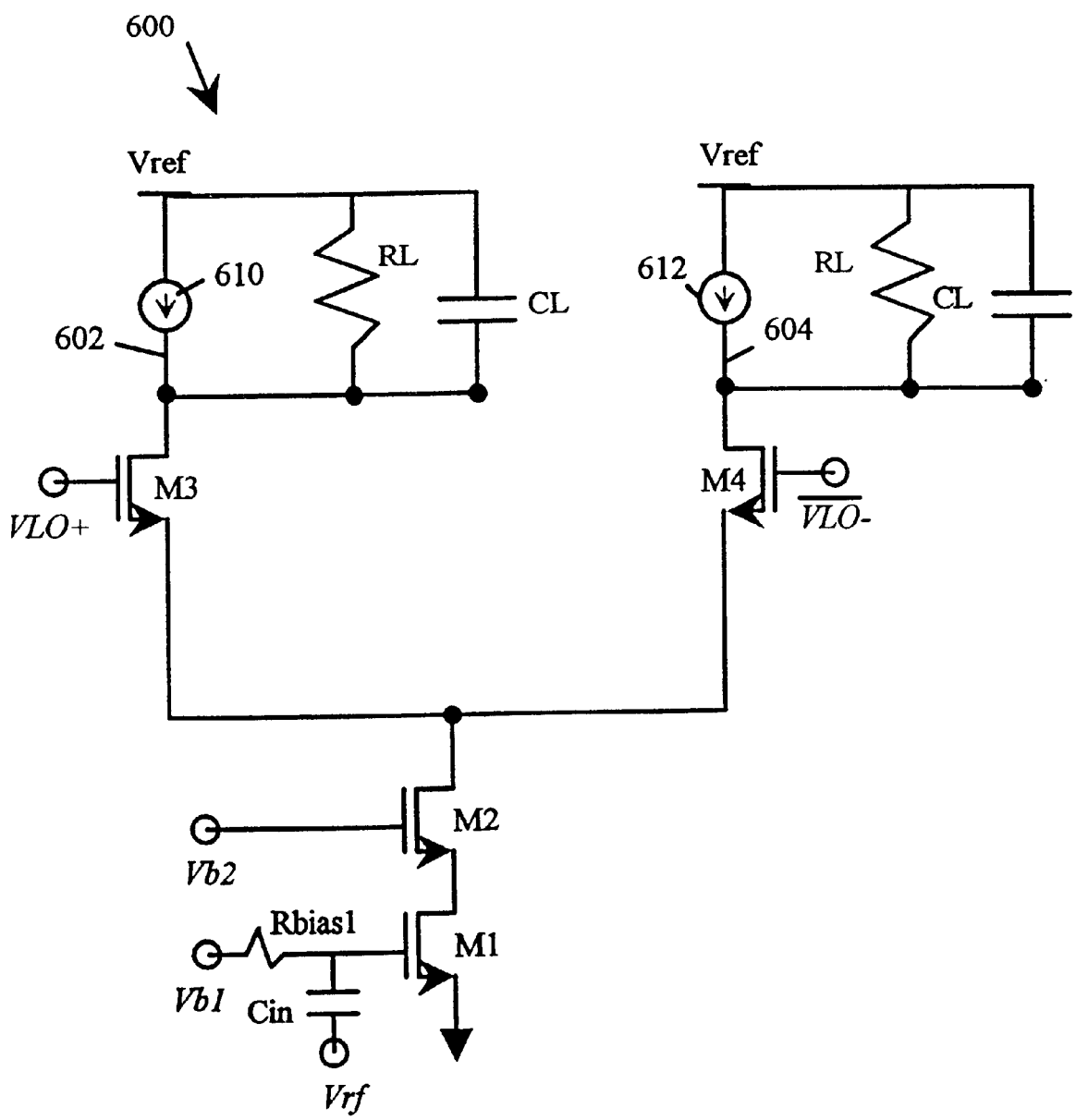
FIG. 6 is a schematic circuit diagram showing an additional embodiment of a square wave mixer.

A common technique for sourcing the large bias current that is typical in the illustrative circuits while fixing the load resistance at $R_L$ is shown by the square wave mixer 600 of FIG. 6. Current sources 610 and 612 are added to allow the current sufficient to bias the MOSFET M1 to flow through the current sources 610 and 612 rather than through the load resistors $R_L$.

Sourcing of currents from the power source Vdd without attenuation by the RC filters 602 and 604 increases the current drive through the MOSFETs M3 and M4, but does so at the expense of linearity of the output signal generated by the square wave mixer 600. The increased current flow through the MOSFETs M3 and M4 results in significant voltage drops ($V_{M3}=IR_{M3}$ and $V_{M4}=IR_{M4}$) across the MOSFETs M3 and M4 due to the resistances $R_{M3}$ and $R_{M4}$ of the devices when turned on.

The flow of large currents through MOSFETs M3 and M4 is disadvantageous for several reasons. First, the large currents continue to cause head room concerns unless the MOSFETs M3 and M4 are made extremely large to reduce the resistances $R_{M3}$ and $R_{M4}$, disadvantageously reducing the operating speed of the MOSFETs M3 and M4. Second, the bias current for MOSFET $M_1$ is supplied by a switched source having a dynamic behaviour that can be complicated. Third, the large currents cause the current sources 610 and 612 coarsely pull the output voltages to Vdd, generating an output voltage glitch that hinders dynamic settling.

Signal fidelity of the square wave mixer 600 is further degraded because the DC current is switched alternately between the first branch 602 and the second branch 604 as the local oscillator square wave signals VLO and $\overline{VLO}$ are switched. Since any inequality in the current sources 610 and 612 and any difference in characteristics of the switches, such as MOSFETs M3 and M4 translate to a DC offset in the output signal $V_{OUT}$. Such a DC offset in the signal $V_{OUT}$ is detrimental in directly coupled circuits.

Figure 7:
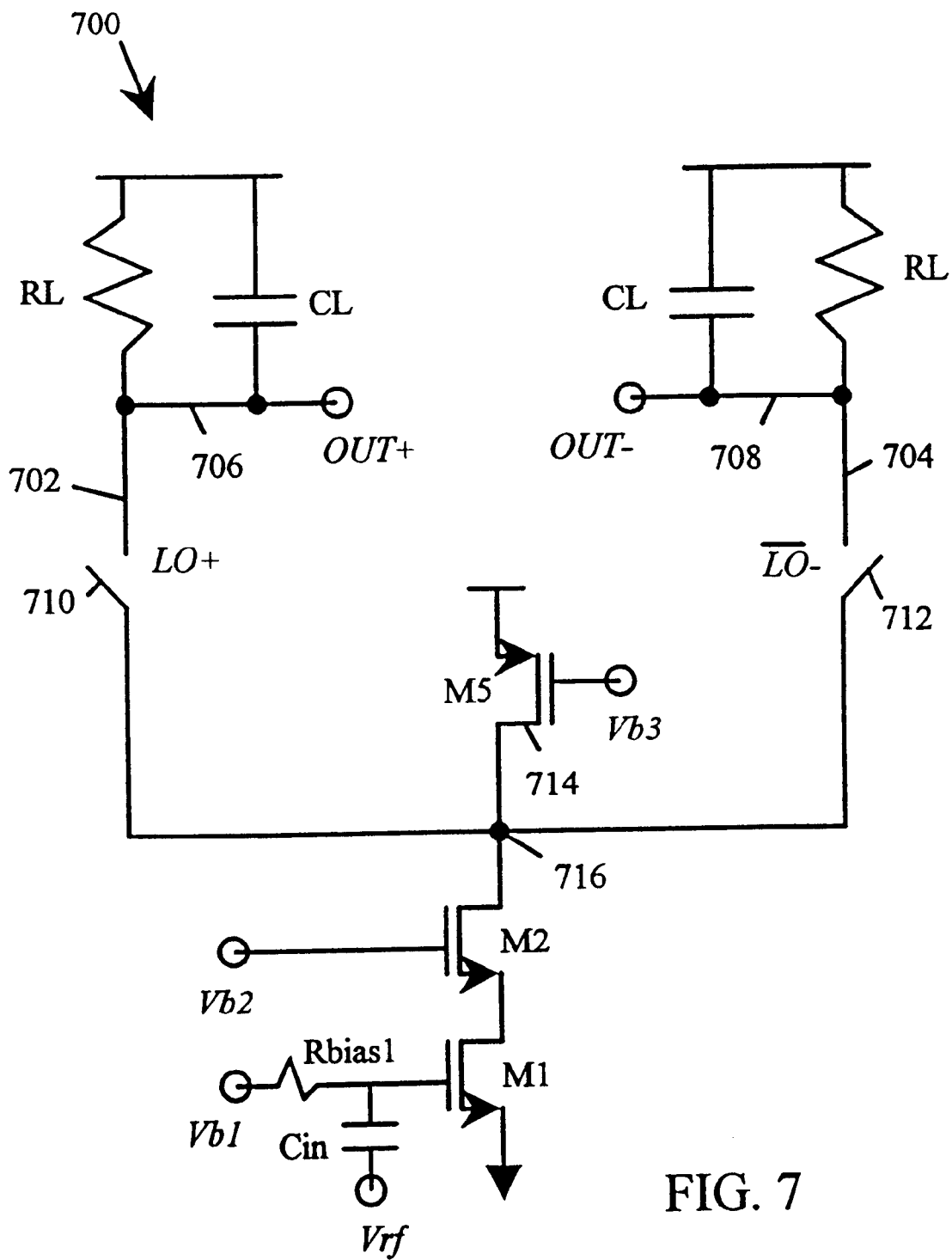
FIG. 7 is a schematic circuit diagram that depicts a square wave mixer which utilizes a current source which causes local oscillator switches to switch only signal current and no DC current.

A simple technique for avoiding the various signal fidelity problems involves placement of a current source 714 on the drain terminal of the biasing MOSFET M2 and allowing switches 710 and 712 in first and second branches 702 and 704, respectively, to switch only signal current, with no DC current switching. FIG. 7 is a schematic circuit diagram that depicts a square wave mixer 700 which utilizes the current source 714. In the illustrative square wave mixer 700, the current source 714 is formed by a MOSFET M5 having a source-drain pathway connected between the power supply $V_{REF}$ and the drain terminal of the biasing MOSFET M2 at a node 716. A disadvantage of adding the current source 714 is that the current source 714 increases noise in the square wave mixer 700 circuit and attenuates the output signal $V_{OUT}$ so that the gain is no longer generated according to equation (1) hereinbefore.

Figure 8:
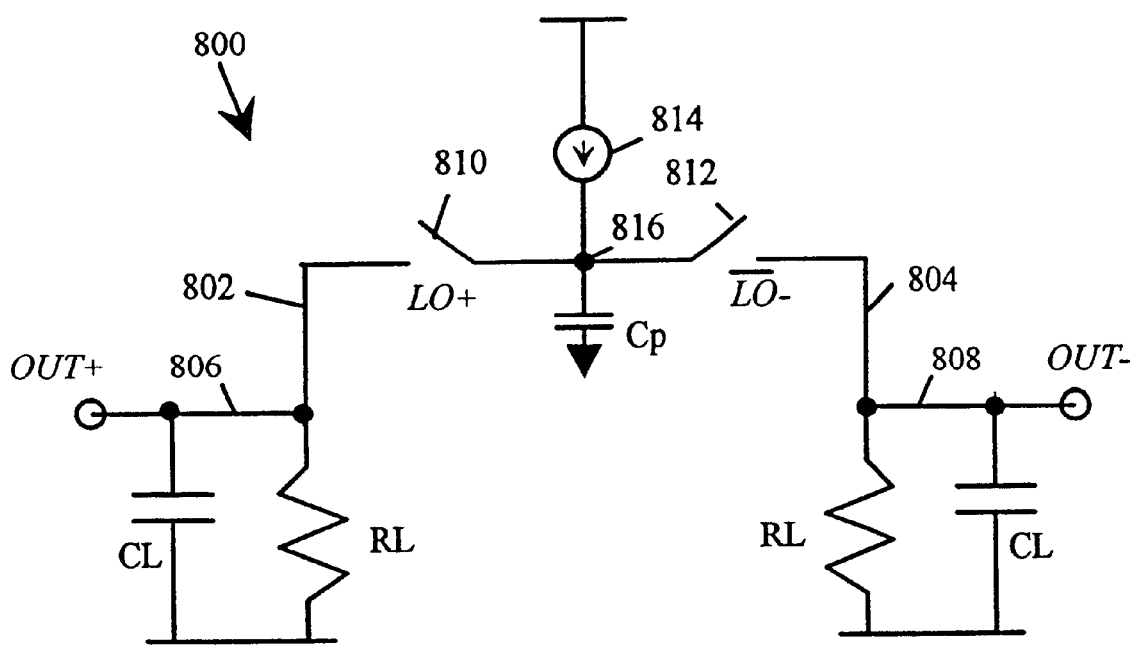
FIG. 8 is a schematic circuit diagram that illustrates an equivalent network to the square wave mixer shown in FIG. 7 with respect to output load resistors $R_L$.

Addition of the current source 714 causes attenuation because sourcing of a large bias current with a low or minimum transconductance ($g_m$) through the MOSFET M5 of the current source 714 forms a large parasitic capacitance at the node 716. Referring to FIG. 8, a schematic circuit diagram illustrates an equivalent network 800 to the square wave mixer 700 shown in FIG. 7 with respect to output load resistors $R_L$. The network 800 includes a current source 814 ($g_m V_{rf}$) that forms a parasitic capacitance $C_P$ at node 816. The network includes two branches 802 and 804 that are connected and branch from the node 816. In the first branch 802, an output terminal OUT+ is connected to the node 816 by a first switch 810 driven by a square wave local oscillator signal LO. The output terminal OUT+ is connected to a first RC filter 806 including a load capacitor $C_L$ and a load resistor $R_L$. In the second branch 804, an output terminal OUT− is connected to the node 816 by a second switch 812 driven by an inverse square wave local oscillator signal $\overline{LO}$. The output terminal OUT− is connected to a second RC filter 806 including a load capacitor $C_L$ and a load resistor $R_L$.

Figure 9A:
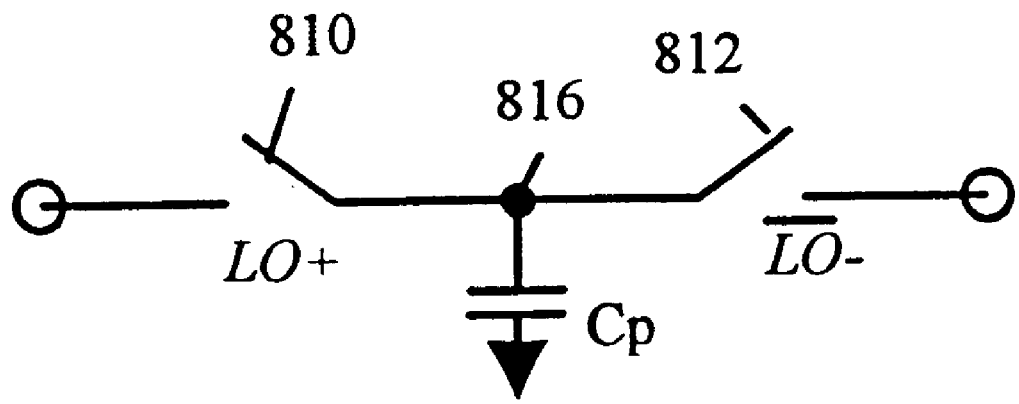
FIGS. 9A and 9B are schematic circuit diagrams that show equivalent circuits for a local oscillator switch circuit shown in FIG. 8 and an equivalent parasitic resistance $R_P$.
Figure 9B:
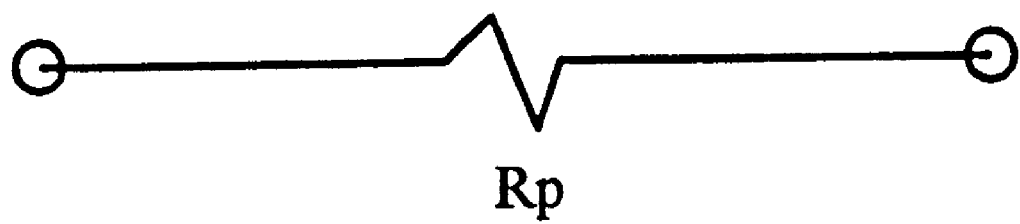

The gain of the network 800 is specified by equations (3), as follows:

$$\frac{V_{IF}}{V_{rf}} = \frac{OUT^+ - OUT^-}{V_{rf}} = \frac{2}{\pi} gmR_L \times \frac{1}{1 + \frac{2R_L}{R_P}}, \quad (3)$$

where $R_P$ is the parasitic resistance across the nodes OUT+ and OUT− that results from the presence of the switches and the parasitic capacitance $C_P$. The parasitic resistance $R_P$ is illustrated in FIGS. 9A and 9B which show two equivalent schematic circuit diagrams. FIG. 9A depicts, from the network 800 shown in FIG. 8, the first and switches 810 and 812, and the parasitic capacitance $C_P$ at the node 816. FIG. 9B shows an equivalent circuit, simply a parasitic resistor $R_P$ where the size of the $R_P$ is specified by the equation (4), as follows:

$$R_P=(1/f_{LO})C_P, \quad (4)$$

where $f_{LO}$ is the frequency of the square wave local oscillator. For typical operating frequency ranges of the square wave local oscillator even small parasitic capacitances $C_P$, effectively have an equivalent resistive value comparable to or smaller than the load resistance $R_L$.

For example, a system with a square wave local oscillator operating at a frequency $f_{LO}$ of 900 MHz ($w_{LO}$ of $2\pi\times900$ MHz), a transconductance $g_m$ of 4m-mhos, and a parasitic capacitance $C_P$ of 0.5 pF. The resulting mixer gain is about 0.04.

Figure 10:
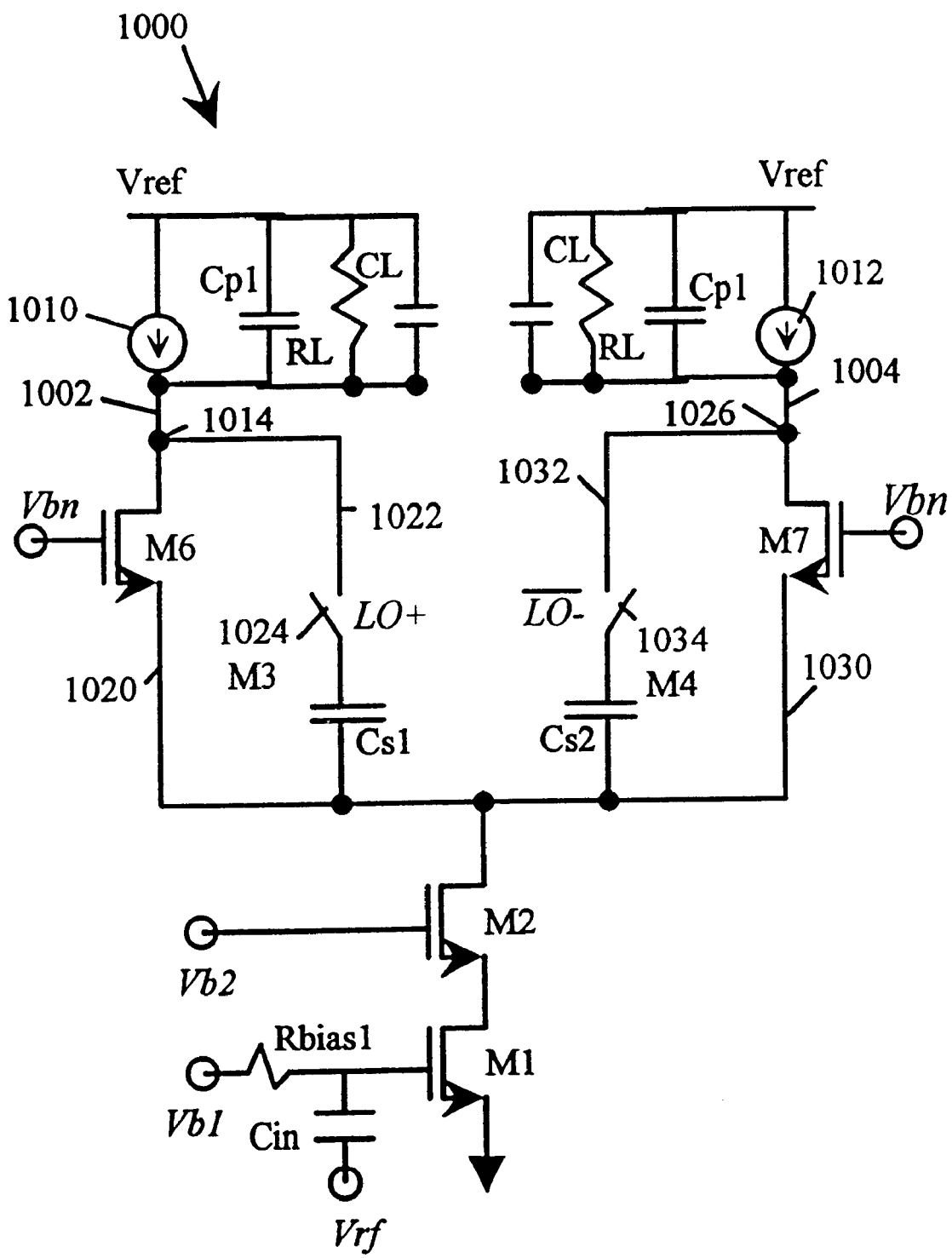
FIG. 10 is a schematic circuit diagram showing a square wave mixer that has a topology with a signal current and a DC current separated.

The discussed problems of parasitics, noise, and nonlinearity are solved by adding a path to a square wave mixer for carrying the signal current and the DC current on different paths. Referring to FIG. 10, a schematic circuit diagram shows a square wave mixer 1000 that has a topology in which the signal current and the DC current are separated. The square wave mixer 1000 has identical first and second branches 1002 and 1004. The first branch 1002 has a current source 1010 and a parasitic capacitor $C_{P1}$ connected in parallel between a power source $V_{REF}$ and a node 1014.

The first branch 1002 includes two paths 1020 and 1022 connected in parallel between the node 1014 and a node 1016. The paths are a DC current path 1020 and a signal current path 1022. The DC current path 1020 includes the source-drain pathway of a MOSFET M6. The MOSFET M6 has a gate terminal connected to a biasing source $V_{bn}$. The signal current path 1022 includes a square wave local oscillator switch 1024 connected in series with a signal capacitor $C_{S1}$. In one example, the square wave local oscillator switch 1024 may be a MOSFET M3.

The second branch 1004 has a current source 1012 and a parasitic capacitor $C_{P2}$ connected in parallel between the power source $V_{REF}$ and a node 1026. The second branch 1004 includes two paths 1030 and 1032 connected in parallel between the node 1026 and the node 1016. The paths are a DC current path 1030 and a signal current path 1032. The DC current path 1030 includes the source-drain pathway of a MOSFET M7. The MOSFET M7 has a gate terminal connected to a biasing source $V_{bn}$. The signal current path 1032 includes a square wave local oscillator switch 1034 connected in series with a signal capacitor $C_{S2}$. In one example, the square wave local oscillator switch 1034 may be a MOSFET M4.

The first and second branches 1002 and 1004 are merged at the node 1016 with a pathway being formed between the node 1016 and ground. The merged pathway of the square wave mixer 1000 includes an input signal MOSFET M1. The gate terminal of the MOSFET M1 is connected to a first biasing voltage source $V_{bias1}$ through a biasing resistor $R_{bias1}$ and also connected to an input voltage source $V_{rf}$ through an input capacitor $C_{IN}$. A biasing MOSFET M2 has a source-drain pathway connected between the node 1016 through to the input signal MOSFET M1. The gate terminal of the biasing MOSFET M2 is connected to a second biasing voltage source $V_{bias2}$.

A DC current that is sufficient to operate the square wave mixer 1000 with low noise and good linearity is directed through the MOSFET M6 in the first pathway 1020 of the first branch 1002 and through the MOSFET M7 in the first pathway 1030 of the second branch 1004. Since the MOSFETs M6 and M7 have a large signal swing capacity, or headroom, available, the MOSFETs M6 and M7 can be biased in saturation with a very small width-to-length ratio (W/L), decreasing the parasitic capacitance at the node 1016 to a small or minimum value.

The parasitic capacitance $C_P$ of the square wave mixer 1000 is divided into two capacitances $C_{P1}$ and $C_{P2}$. The parasitic capacitances in the square wave mixer 1000 operate in the intermediate frequency (IF) region rather than a high frequency region and are not switched capacitances, the parasitic capacitors $C_{P1}$ and $C_{P2}$ are rendered essentially harmless. The intermediate frequency (IF) signal is forced through the square wave local oscillator switch 1024 and capacitor $C_{S1}$, and the square wave local oscillator switch 1034 and capacitor $C_{S2}$ in the pathways 1030 and 1032, respectively, rather than through the MOSFETs M6 and M7. Note that the capacitors $C_{S1}$, and $C_{S1}$, may alternatively be connected as a single capacitor since one and only one of the square wave local oscillator switches 1024 and 1034 is closed at any time.

RC filters including a load resistor $R_L$ and a load capacitor $C_L$ are connected in parallel and further connected in parallel with both the capacitance $C_{P1}$ in the first branch 1002 and the capacitance $C_{P2}$ in the second branch 1004.

The impedance with respect to the signal is $1/(2g_m)$ in parallel with $(1/(f_{rf}C_S)+R_{ON})$ where $R_{ON}$ is the switching resistance of the square wave local oscillator switches 1024 and 1034 and $f_{rf}$ is a reference frequency.

Since any signal current $g_m V_{REF}$ from MOSFET M1 that flows through MOSFETs M6 and M7 causes signal attenuation, operation is best when all signal current flows through capacitor $CS_1$ and MOSFET M3 switching local oscillator LO+ 1024 and through capacitor $CS_2$ and MOSFET M4 local oscillator LO- 1034. The best operation occurs only when, at the rf frequency, the condition holds that $$\frac{2}{gm} >> \left(\frac{1}{F_{rf}Cs} + Ron\right).$$

The condition is satisfied by reducing the transconductance gm of MOSFETs M6 and M7 at the rf frequencies.

Figure 11:
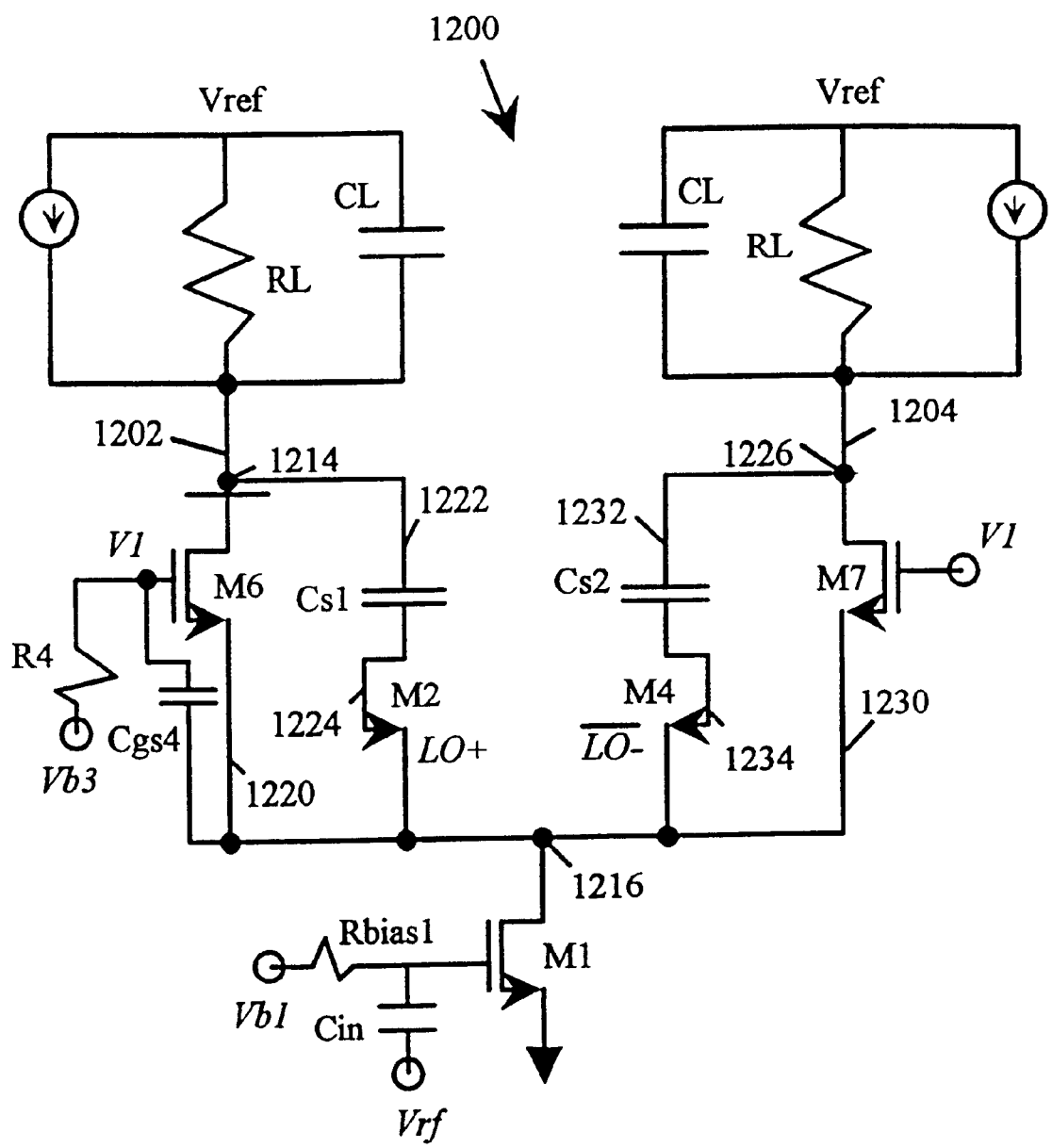
FIG. 11 is a schematic circuit diagram of a square wave mixer with a circuit topology that avoids gain reduction.

The transconductance $g_m$ of the MOSFETs M6 and M7 can be reduced to zero by short-circuiting the gate terminal and source terminal of the MOSFETs M6 and M7 through a capacitor, depicted as capacitor $C_{gs4}$ in FIG. 11. A schematic circuit diagram of a square wave mixer 1200 shows a circuit topology that avoids gain reduction. The capacitor $C_{gs4}$ is connected between the gate terminal of the MOSFET M6 and a node 1216 in a first branch 1202 of the square wave mixer 1200. Similarly, a capacitor $C_{gs4}$ can be connected between the gate terminal of the MOSFET M7 and the node 1216 in a second branch 1204 of the square wave mixer 1200. The basic square wave mixer 1200 has a first branch 1202 and a second branch 1204. The first branch 1202 has a load resistor $R_L$ connected between a power source $V_{REF}$ and a node 1214. The first branch 1202 includes two paths 1220 and 1222 connected in parallel between the node 1214 and a node 1216. The paths are a DC current path 1220 and a signal current path 1222. The DC current path 1220 includes the source-drain pathway of a MOSFET M6. The MOSFET M6 has a gate terminal connected to a biasing source $V_{b3}$ through a register $R_4$. The signal current path 1222 includes a square wave local oscillator switch 1224, a MOSFET M3, connected in series with a signal capacitor $C_{S1}$. A capacitor $C_{gs4}$ is connected between the gate terminal of the MOSFET M6 and the node 1216. In an illustrative square wave mixer circuit, resistor $R_4$ and capacitor $C_{gs4}$ are designed so that $1/(2\pi R_4 C_{gs4}) << f_{rf}$.

The second branch 1204 has a load resistor $R_L$ connected between the power source $V_{REF}$ and a node 1226. The second branch 1204 includes two paths 1230 and 1232 connected in parallel between the node 1226 and the node 1216. The paths are a DC current path 1230 and a signal current path 1232. The DC current path 1230 includes the source-drain pathway of a MOSFET M7. The MOSFET M7 has a gate terminal connected to the biasing source $V_{b3}$ through the resistor $R_4$. The signal current path 1232 includes a square wave local oscillator switch 1234, a MOSFET M4, connected in series with a signal capacitor $C_{S2}$.

The first and second branches 1202 and 1204 are merged at the node 1216 with a pathway being formed between the node 1216 and ground. The merged pathway of the square wave mixer 1200 includes an input signal MOSFET M1. The gate terminal of the MOSFET M1 is connected to a first biasing voltage source $V_{bias1}$ through a biasing resistor $R_{bias1}$ and also connected to an input voltage source $V_{rf}$ through an input capacitor $C_{IN}$.

Figure 12:
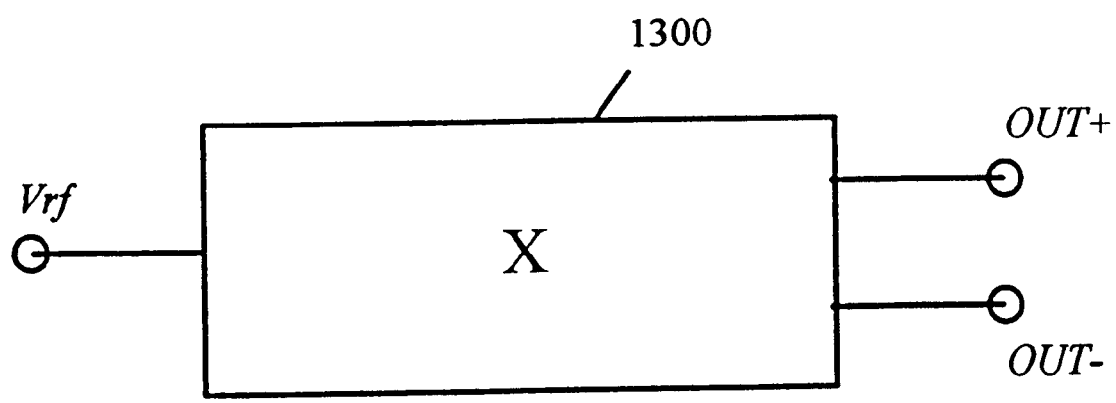
FIG. 12 is a schematic block diagram depicting "black-box" connections of a square wave mixer/multiplier. The use of the same reference symbols in different drawings indicates similar or identical items.

Referring to FIG. 12, a schematic block diagram depicts the "black-box" connections of a square wave mixer/multiplier 1300. The square wave mixer/multiplier 1300 has a single system input terminal $V_{rf}$ and two output terminals including an OUT+ terminal and an OUT− terminal. An output voltage signal $V_{OUT}$ is the difference of the OUT+−OUT− signals.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims. For example, the illustrative signal processing system may be formed in an integrated circuit, several integrated circuits, or formed in a plurality of hardware logic or circuit components. Similarly, the signal processing system may be controlled by a process executed on a digital signal processor controlled by software. In other embodiments, the signal processing system may be implemented using a general-purpose computer, a microprocessor, or other computational device.

While various components of the circuit are described as containing a particular type of active device, for example a MOSFET, other types of devices may be utilized, such as other types of field effect transistors (FETs), bipolar transistors, or other types of active devices.

In the language of the claims, the word "a" is used to express "one or more than one" in describing the number of claimed elements.

What is claimed is:

1. An apparatus comprising:
    a circuit coupled between a first voltage reference and a second voltage reference, the circuit including a first square wave oscillator branch and a second square wave oscillator branch, the first square wave oscillator branch being driven by a square wave oscillator signal and the second square wave oscillator branch being driven by an inverse of the square wave oscillator; and
    the first and second square wave oscillator branches each including a DC current path and a signal current path, the signal current path being driven by the square wave oscillator signal and the inverse of the square wave oscillator signal, respectively.

2. The apparatus according to claim 1 further comprising:
    a node coupling the first and second square wave oscillator branches; and
    a common pathway coupled between the node and the second voltage reference.

3. The apparatus according to claim 1 further comprising:
    a node coupling the first and second square wave oscillator branches;
    a common pathway coupled between the node and the second voltage reference; and
    a system input transistor having a conductive pathway on the common pathway and having a control terminal for control by a system input signal.

4. The apparatus according to claim 1 further comprising:
    a node coupling the first and second square wave oscillator branches;
    a common pathway coupled between the node and the second voltage reference;
    a system input transistor having a conductive pathway on the common pathway and having a control terminal for control by a system input signal; and
    a biasing signal coupled to the control terminal of the system input transistor.

5. The apparatus according to claim 1 further comprising:
    a node coupling the first and second square wave oscillator branches;
    a common pathway coupled between the node and the second voltage reference;
    a system input transistor having a conductive pathway on the common pathway and having a control terminal for control by a system input signal;
    a biasing signal coupled to the control terminal of the system input transistor;
    a biasing resistor on a line coupling the biasing signal to the control terminal of the system input transistor; and
    a system input capacitor coupling the system input signal to the control terminal of the system input transistor.

6. The apparatus according to claim 1 wherein:
    the DC current paths in the first and second square wave oscillator branches include a biasing transistor with a source-drain pathway aligned with the DC current path and a gate terminal coupled to a biasing voltage source.

7. The apparatus according to claim 1 further comprising:
    the DC current paths in the first and second square wave oscillator branches include a biasing transistor with a source-drain pathway aligned with the DC current path and a gate terminal coupled to a biasing voltage source; and
    a biasing resistor coupled between the biasing voltage source and the gate terminal of the biasing transistor in at least one of the DC current paths.

8. The apparatus according to claim 1 further comprising:
    the DC current paths in the first and second square wave oscillator branches include a biasing transistor with a source-drain pathway aligned with the DC current path and a gate terminal coupled to a biasing voltage source; and
    a capacitor coupled between the gate terminal of the biasing transistor and the second voltage reference.

9. The apparatus according to claim 1 wherein:
    the signal current paths in the first and second square wave oscillator branches include a local oscillator transistor having a source-drain pathway aligned with the signal current path and a gate terminal coupled to a square wave oscillator signal and to an inverse of the square wave oscillator signal, respectively, in the first and second square wave oscillator branches.

10. The apparatus according to claim 1 further comprising:
    the signal current paths in the first and second square wave oscillator branches include a local oscillator transistor having a source-drain pathway aligned with the signal current path and a gate terminal coupled to a square wave oscillator signal and to an inverse of the square wave oscillator signal, respectively, in the first and second square wave oscillator branches; and
    a capacitor coupled on the signal current paths in the first and second square wave oscillator branches in series with the local oscillator transistor.

11. The apparatus according to claim 1 further comprising:
    in at least one of the first and second square wave oscillator branches, a load resistor coupled between the first voltage reference and a node coupling the DC current path and the signal current path.

12. The apparatus according to claim 1 further comprising:
    in at least one of the first and second square wave oscillator branches, a current source coupled between the first voltage reference and a node coupling the DC current path and the signal current path.

13. The apparatus according to claim 1 further comprising:
    in at least one of the first and second square wave oscillator branches, a current source coupled between the first voltage reference and a node coupling the DC current path and the signal current path; and
    in at least one of the first and second square wave oscillator branches, an RC filter coupled between the second voltage reference and the node coupling the DC current path and the signal current path.

14. The apparatus according to claim 1 further comprising:
- in at least one of the first and second square wave oscillator branches, a current source coupled between the first voltage reference and a node coupling the DC current path and the signal current path;
- in at least one of the first and second square wave oscillator branches, an RC filter coupled between the second voltage reference and the node coupling the DC current path and the signal current path; and
- a biasing transistor having a source-drain pathway coupled between the RC filter coupled and the node coupling the DC current path and the signal current path.

15. The apparatus according to claim 1 further comprising:
- in at least one of the first and second square wave oscillator branches, a current source coupled in parallel with a parasitic capacitor, the current source and parasitic capacitor being coupled between the first voltage reference and a node coupling the DC current path and the signal current path.

16. The apparatus according to claim 1 wherein:
the apparatus is a square wave analog multiplier.

17. The apparatus according to claim 1 wherein:
the apparatus is a square wave analog mixer.

18. A method of processing a signal comprising:
- mixing the signal with an oscillating signal, the signal having a signal current flowing in a signal current path;
- alternately switching the oscillating signal using a square wave oscillation, the switching operation being made by switches having inherently different switching characteristics that translate to a DC offset current; and
- adding a current source in parallel with the signal current path, the current source being in a DC signal path for switching the DC offset current, the signal current path thereby switching only signal current with substantially no switching of DC current.

19. The method according to claim 18 further comprising:
mixing the signal in two branches with the first branch being oscillated by a square wave oscillating signal and the second branch being oscillated by a complementary square wave oscillating signal that is the inverse of the square wave oscillating signal.

20. The method according to claim 18 further comprising:
sourcing a current through the parallel connection of the signal current path and the DC current path.

21. The method according to claim 18 further comprising:
- sourcing a current through the parallel connection of the signal current path and the DC current path; and
- filtering the parallel connection of the signal current path and the DC current path to remove high frequency components and retain a down-converted signal.

22. A method of processing a signal comprising:
- coupling a circuit including a first square wave oscillator branch and a second square wave oscillator branch between a first voltage reference and a second voltage reference;
- driving the first square wave oscillator branch using a square wave oscillator signal;
- driving the second square wave oscillator branch using an inverse of the square wave oscillator signal; and
- separating each of the first and second square wave oscillator branches into a DC current path and a signal current path, the signal current path being driven by the square wave oscillator signal and the inverse of the square wave oscillator signal, respectively, the DC current path carrying a DC current, removing DC offset of signals in the signal current paths.

23. The method according to claim 22 further comprising:
- connecting the first and second oscillator branches into a common pathway; and
- applying a system input signal to control the current in the common pathway.

24. The method according to claim 22 further comprising:
biasing the current in the common pathway.

25. The method according to claim 24 further comprising:
biasing the currents in the DC current paths in the first and second square wave oscillator branches.

26. The method according to claim 22 further comprising:
sourcing a current to the first square wave oscillator branch and to the second square wave oscillator branch.

27. The method according to claim 22 further comprising:
- sourcing a current to the first square wave oscillator branch and to the second square wave oscillator branch; and
- filtering signals in the first square wave oscillator branch and the second square wave oscillator branch using an RC filter.

28. The method according to claim 22 further comprising:
- sourcing a current to the DC current path and the signal current path in at least one of the first and second square wave oscillator branches;
- filtering signals in the DC current path and the signal current path in at least one of the first and second square wave oscillator branches using an RC filter; and
- biasing the current in a pathway to the RC filter.

29. The method according to claim 22 further comprising:
coupling a current source coupled in parallel with a parasitic capacitor between a first voltage reference and a node coupling the DC current path and the signal current path in at least one of the first and second square wave oscillator branches.

30. A signal processor comprising:
- means for coupling a circuit including a first square wave oscillator branch and a second square wave oscillator branch between a first voltage reference and a second voltage reference;
- means for driving the first square wave oscillator branch using a square wave oscillator signal;
- means for driving the second square wave oscillator branch using an inverse of the square wave oscillator signal; and
- means for separating each of the first and second square wave oscillator branches into a DC current path and a signal current path, the signal current path being driven by the square wave oscillator signal and the inverse of the square wave oscillator signal, respectively, the DC current path carrying a DC current, removing DC offset of signals in the signal current paths.

31. The signal processor according to claim 30 further comprising:
- means for connecting the first and second oscillator branches into a common pathway; and
- means for applying a system input signal to control the current in the common pathway.

32. The signal processor according to claim 30 further comprising:
    means for biasing the current in the common pathway.
33. The signal processor according to claim 32 further comprising:
    means for biasing the currents in the DC current paths in the first and second square wave oscillator branches.
34. The signal processor according to claim 30 further comprising:
    means for sourcing a current to the first square wave oscillator branch and to the second square wave oscillator branch.
35. The signal processor according to claim 30 further comprising:
    means for sourcing a current to the first square wave oscillator branch and to the second square wave oscillator branch; and
    means for filtering signals in the first square wave oscillator branch and the second square wave oscillator branch using an RC filter.
36. The signal processor according to claim 30 further comprising:
    means for sourcing a current to the DC current path and the signal current path in at least one of the first and second square wave oscillator branches;
    means for filtering signals in the DC current path and the signal current path in at least one of the first and second square wave oscillator branches using an RC filter; and
    means for biasing the current in a pathway to the RC filter.
37. The signal processor according to claim 30 further comprising:
    means for coupling a current source coupled in parallel with a parasitic capacitor between a first voltage reference and a node coupling the DC current path and the signal current path in at least one of the first and second square wave oscillator branches.

* * * * *